US010203351B2

(12) United States Patent
Zhang (10) Patent No.: US 10,203,351 B2
(45) Date of Patent: Feb. 12, 2019

(54) MEMS ACCELEROMETER WITH Z AXIS ANCHOR TRACKING (71) Applicant: Analog Devices, Inc., Norwood, MA (US)

(72) Inventor: Xin Zhang, Acton, MA (US)

(73) Assignee: Analog Devices, Inc., Norwood, MA (US)

(*) Notice: Subject to any disclaimer, the term of this patent is extended or adjusted under 35 U.S.C. 154(b) by 95 days.

(21) Appl. No.: 14/505,928

(22) Filed: Oct. 3, 2014

(65) Prior Publication Data

US 2016/0097791 A1 Apr. 7, 2016

(51) Int. Cl.
*G01P 15/125* (2006.01)
*B81B 3/00* (2006.01)
*G01P 15/08* (2006.01)

(52) U.S. Cl.
CPC .......... *G01P 15/125* (2013.01); *B81B 3/0021* (2013.01); *B81B 3/0054* (2013.01); *B81B 2201/0235* (2013.01); *B81B 2203/058* (2013.01); *G01P 2015/0831* (2013.01)

(58) Field of Classification Search
CPC ..... G01P 2015/0831; G01P 2015/0834; G01P 15/125
USPC ....................... 73/514.32, 514.17, 497, 54.32
See application file for complete search history.

(56) References Cited

U.S. PATENT DOCUMENTS

| | | | |
|---|---|---|---|
| 5,646,347 A | 7/1997 | Weiblen et al. | |
| 5,719,336 A | 2/1998 | Ando et al. | 73/514.32 |
| 5,939,633 A | 8/1999 | Judy | |
| 6,230,563 B1 | 5/2001 | Clark et al. | |
| 6,841,992 B2 | 1/2005 | Yue et al. | 324/162 |
| 6,892,576 B2 | 5/2005 | Samuels et al. | 73/514.32 |
| 6,936,492 B2 | 8/2005 | McNeil et al. | |
| 7,197,928 B2 | 4/2007 | Chen et al. | |
| 7,240,552 B2 | 7/2007 | Acar et al. | |
| 7,444,869 B2 | 11/2008 | Johnson et al. | |
| 7,520,171 B2 | 4/2009 | Merassi et al. | |
| 7,610,809 B2 | 11/2009 | McNeil et al. | 73/514.32 |

(Continued)

FOREIGN PATENT DOCUMENTS

| | | |
|---|---|---|
| CN | 102375075 A | 3/2012 |
| CN | 103852598 A | 6/2014 |

(Continued)

OTHER PUBLICATIONS

International Searching Authority, International Search Report—International Application No. PCT/US2015/052597, dated Jan. 26, 2016, together with the Written Opinion of the International Searching Authority, 12 pages.

(Continued)

*Primary Examiner* — Manish S Shah
*Assistant Examiner* — Jean Morello
(74) *Attorney, Agent, or Firm* — Wolf, Greenfield & Sacks, P.C.

(57) ABSTRACT

In some exemplary embodiments, a MEMS accelerometer includes a device wafer having a proof mass and a plurality of tracking anchor points attached to a substrate. Each tracking anchor is configured to deflect in response to asymmetrical deformation in the substrate, and transfer mechanical forces generated in response to the deflection to tilt the proof mass in a direction of the deformation.

20 Claims, 8 Drawing Sheets
(8 of 8 Drawing Sheet(s) Filed in Color)

(56) References Cited

U.S. PATENT DOCUMENTS

| | | | |
|---|---|---|---|
| 8,056,415 B2 | 11/2011 | McNeil et al. | |
| 8,146,425 B2 | 4/2012 | Zhang et al. | 73/514.32 |
| 8,215,177 B2 | 7/2012 | Hayner et al. | |
| 8,321,170 B2 | 11/2012 | Schultz et al. | |
| 8,443,667 B2 | 5/2013 | Trusov et al. | |
| 8,453,504 B1 | 6/2013 | Mao | |
| 8,555,720 B2 | 10/2013 | Schultz | |
| 8,689,632 B2* | 4/2014 | Jia | G01C 19/5762 73/504.12 |
| 8,839,670 B2 | 9/2014 | Qiu et al. | |
| 8,960,002 B2 | 2/2015 | Nasiri et al. | |
| 8,978,475 B2 | 3/2015 | Acar | |
| 9,010,184 B2 | 4/2015 | Zou et al. | |
| 9,097,524 B2 | 8/2015 | Seeger et al. | |
| 9,134,337 B2 | 9/2015 | Simoni et al. | |
| 9,176,157 B2 | 11/2015 | Simoni et al. | 73/514.32 |
| 9,612,254 B2 | 4/2017 | Naumann | |
| 9,927,459 B2 | 3/2018 | Clark et al. | |
| 2004/0231420 A1 | 11/2004 | Xie et al. | |
| 2008/0178671 A1 | 7/2008 | Miller | |
| 2009/0314085 A1* | 12/2009 | Stahl | G01P 15/125 73/514.32 |
| 2010/0107763 A1 | 5/2010 | Lin et al. | 73/514.32 |
| 2011/0023604 A1* | 2/2011 | Cazzaniga | G01C 19/5712 73/514.32 |
| 2011/0030473 A1 | 2/2011 | Acar | |
| 2011/0049648 A1* | 3/2011 | Geisberger | B81C 1/00182 257/415 |
| 2012/0125104 A1 | 5/2012 | Qiu et al. | |
| 2013/0068018 A1 | 3/2013 | Seeger et al. | |
| 2013/0104651 A1* | 5/2013 | Li | G01C 19/5762 73/504.12 |
| 2013/0180332 A1 | 7/2013 | Jia et al. | 73/504.12 |
| 2013/0186171 A1 | 7/2013 | Merrill, Jr. et al. | 73/1.38 |
| 2013/0214367 A1* | 8/2013 | van der Heide | H01L 29/84 257/415 |
| 2013/0333471 A1 | 12/2013 | Chien | 73/514.32 |
| 2014/0298909 A1* | 10/2014 | Simoni | B81B 7/0048 73/514.32 |
| 2014/0360268 A1 | 12/2014 | Qiu et al. | |
| 2015/0122024 A1 | 5/2015 | Clark et al. | |
| 2015/0192603 A1 | 7/2015 | Baldasarre et al. | |
| 2015/0268268 A1* | 9/2015 | Liu | G01P 15/125 73/514.32 |
| 2015/0293141 A1* | 10/2015 | Wu | G01P 15/125 73/504.12 |
| 2016/0377648 A1 | 12/2016 | Zhang | |
| 2018/0038887 A1 | 2/2018 | Zhang et al. | |

FOREIGN PATENT DOCUMENTS

| | | | |
|---|---|---|---|
| DE | 102013111787 A1 * | 6/2014 | B81B 7/0048 |
| EP | 1 640 726 A1 | 3/2006 | |
| JP | 4787746 B2 | 10/2011 | |
| JP | 5627590 B2 | 11/2014 | |
| JP | 5638598 B2 | 12/2014 | |
| JP | 5714648 B2 | 5/2015 | |
| JP | 6144704 B2 | 6/2017 | |
| WO | WO 2012/122879 A1 | 9/2012 | |

OTHER PUBLICATIONS

International Search Report and Written Opinion dated Dec. 10, 2014 for Application No. PCT/US2014/057582.

International Search Report and Written Opinion dated Nov. 8, 2017 in connection with International Application No. PCT/US2017/044581.

U.S. Appl. No. 15/890,835, filed Feb. 7, 2018, Clark.

* cited by examiner

MEMS ACCELEROMETER WITH Z AXIS ANCHOR TRACKING

TECHNICAL FIELD

The present disclosure relates generally to a MEMS accelerometer with tracking anchors that are responsive to deformations in the substrate. In particular, tracking anchors apply a force to torsional springs coupled to the proof mass to counteract the impact of the deformations.

BACKGROUND

An accelerometer is a type of transducer that converts acceleration forces into electronic signals. Accelerometers are used in a wide variety of devices and for a wide variety of applications. For example, accelerometers are often included in various automobile systems, such as for air-bag deployment and roll-over detection. Accelerometers are often also included in many computer devices, such as for motion-based sensing (e.g., drop detection) and control (e.g., motion-based control for gaming).

Microelectromechanical systems ("MEMS," also referred to as "MEMS devices") are a specific type of integrated circuit used in a growing number of applications. For example, MEMS currently are implemented as gyroscopes to detect pitch angles of airplanes, and as accelerometers to selectively deploy air bags in automobiles. In simplified terms, such MEMS devices typically have a movable structure suspended above a substrate, and associated circuitry that both senses movement of the suspended structure and delivers the sensed movement data to one or more external devices (e.g., an external computer). The external device processes the sensed data to calculate the property being measured (e.g., pitch angle or acceleration).

Generally speaking, a MEMS (Micro Electro Mechanical System) accelerometer typically includes, among other things, a proof mass and one or more sensors for sensing movement or changes in position of the proof mass induced by external accelerations. Accelerometers can be configured to sense one, two, three, or even more axes of acceleration. Typically, the proof mass is configured in a predetermined device plane, and the axes of sensitivity are generally referred to with respect to this device plane. For example, accelerations sensed along an axis parallel to the device plane are typically referred to as X or Y axis accelerations, while accelerations sensed along an axis perpendicular to the device plane are typically referred to as Z axis accelerations. A single-axis accelerometer might be configured to detect just X or Y axis accelerations or just Z axis accelerations. A two-axis accelerometer might be configured to detect X and Y axis accelerations or might be configured to detect X and Z axis accelerations. A three-axis accelerometer might be configured to detect X, Y, and Z axis accelerations.

One category of Z-axis accelerometer uses a proof mass that is configured in a "teeter-totter" or "see-saw" configuration, where the proof mass is supported from a substrate such that the proof mass rotates relative to the substrate under Z-axis acceleration. Sense electrodes placed below (e.g., on the underlying substrate) or both above and below the proof mass, which in many types of accelerometers are capacitively coupled with the proof mass, are used to sense such rotation of the proof mass and thereby to sense Z-axis acceleration. Other electrical components, such as feedback electrodes, also may be included below and/or above the proof mass. U.S. Pat. No. 7,610,809 and US Patent Application Publication No. 2013/0333471 provide examples of differential teeter-totter type Z-axis accelerometers having electrodes both above and below the proof mass. U.S. Pat. Nos. 6,841,992 and 5,719,336 provide other examples of such teeter-totter type accelerometers. U.S. Pat. No. 8,146,425 describes a MEMS sensor with movable z-axis sensing element. Each of these references is hereby incorporated by reference in its entirety.

SUMMARY OF EXEMPLARY EMBODIMENTS

In one exemplary embodiment of the present solution, a MEMS accelerometer includes a device wafer having a teeter-totter proof mass and a plurality of tracking anchor points attached to a substrate. Each tracking anchor is configured to deflect in response to deformation in the substrate, and transfer mechanical forces generated in response to the deflection to tilt the proof mass in a direction of the deformation.

In some embodiments, the ratio of the tilt of the proof mass and the deflection of at least one tracking anchor is between about 0.5 and about 0.603. In other embodiments, the ratio is between about 0.4784 and about 0.5. In some embodiments, the ratio is about 0.5.

In various embodiments, the MEMS accelerometer may also include a T-shaped beam, a frame, and torsional springs. The at least one tracking anchor may transfer mechanical forces generated in response to the deflection to the T-shaped beam. The T-shaped beam may transfer the mechanical forces that it receives to the frame. The frame may transfer the mechanical forces that it receives to the torsional springs. Further, the torsional springs may apply a torque to an anchor of the proof mass to tilt the proof mass in a direction of the deformation.

In some embodiments, the MEMS accelerometer may include a plurality of beams, and each beam may directly connect a unique tracking anchor to the frame. Further, each tracking anchor may transfer mechanical forces generated in response to the deflection to its respective beam. Each beam may transfer the mechanical forces that it receives to the frame. The frame may transfer the mechanical forces that it receives to the torsional springs, and the torsional springs may apply a torque to an anchor of the proof mass to tilt the proof mass in a direction of the deformation.

Moreover, the proof mass may be a teeter totter proof mass or a tilt mode proof mass.

Additional embodiments may be disclosed and claimed.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The foregoing and advantages of the invention will be appreciated more fully from the following further description thereof with reference to the accompanying drawings wherein.

It should be noted that the foregoing figures and the elements depicted therein are not necessarily drawn to consistent scale or to any scale. Unless the context otherwise suggests, like elements are indicated by like numerals.

DETAILED DESCRIPTION OF SPECIFIC EMBODIMENTS

Definitions. As used in this description and the accompanying claims, the following terms shall have the meanings indicated, unless the context otherwise requires:

The term "zero-g bias offset" means that an accelerometer outputs a non-zero acceleration signal when no external acceleration is present and the accelerometer should output a zero acceleration signal. In the context of this patent application, zero-g-bias can be caused by deformation of the substrate supporting the accelerometer, including asymmetrical deformation.

In various scenarios, the substrates of MEMS accelerometers may become deformed when the accelerometers are being used. For example, a particular portion of the substrate may experience internal thermal-mechanical stress or absorb impact from an external force, such as a jolt or bending force. When the substrate deforms in a heterogeneous manner (e.g., asymmetrically), the deformation can change the nominal distance (and hence also the capacitance) between a proof mass and one or more position sensing electrodes and consequently introduce error into the accelerometer's measurements (referred to herein as "zero-g bias offset"). For example, even when no external acceleration is present, the accelerometer may output a non-zero acceleration signal based on this change in nominal distance/capacitance caused by the asymmetrical deformation.

Certain exemplary embodiments are described herein with reference to a "teeter-totter" type accelerometer that uses differential capacitance sensing, though other types of accelerometers may be used. Under normal operation, a teeter-totter type accelerometer determines Z-axis acceleration based on the changes in capacitance between the proof mass and differential sense electrodes positioned above and/or below the proof mass. For example, a teeter-totter type accelerometer described in United States Patent Application Publication No. US 2013/0333471, which is hereby incorporated herein by reference in its entirety, uses a set of differential sense electrodes under a teeter-totter proof mass as well as a set of differential sense electrodes above the teeter-totter proof mass. Nominally, when the substrate experiences no deformation and no external Z-axis acceleration is present, the distances between the proof mass and each of the underlying differential sense electrodes are equal and therefore the capacitances between the proof mass and each of these underlying differential sense electrodes are equal. Similarly, the distances between the proof mass and each of the overlying differential sense electrodes are equal and therefore the capacitances between the proof mass and each of these overlying differential sense electrodes are equal. Since the capacitances of each set of differential sense electrodes are equal, they cancel each other out and therefore the accelerometer outputs a zero acceleration signal (i.e., there is no zero-g bias).

Generally speaking, if the substrate experiences symmetrical deformation, the capacitances between the proof mass and each sense electrode will experience the same amount of change. In this manner, any zero-g bias offset induced by the deformation will be canceled out. However, in the case of asymmetrical deformation, the capacitors exhibit different changes. In particular, tilting on one side of the proof mass will create the same amount of tilting on the other side. Because the differential sense capacitances on opposite sides of the proof mass thus experience different amounts of change, a zero-g bias will be present in the accelerometer's measurements. However, controlling the amount of tilting by the proof mass can ensure that the differential sense capacitances on opposite sides of the proof mass exhibit the same amount of change to nullify (e.g., reduce or cancel) the zero-g bias offset.

Figure 1A:
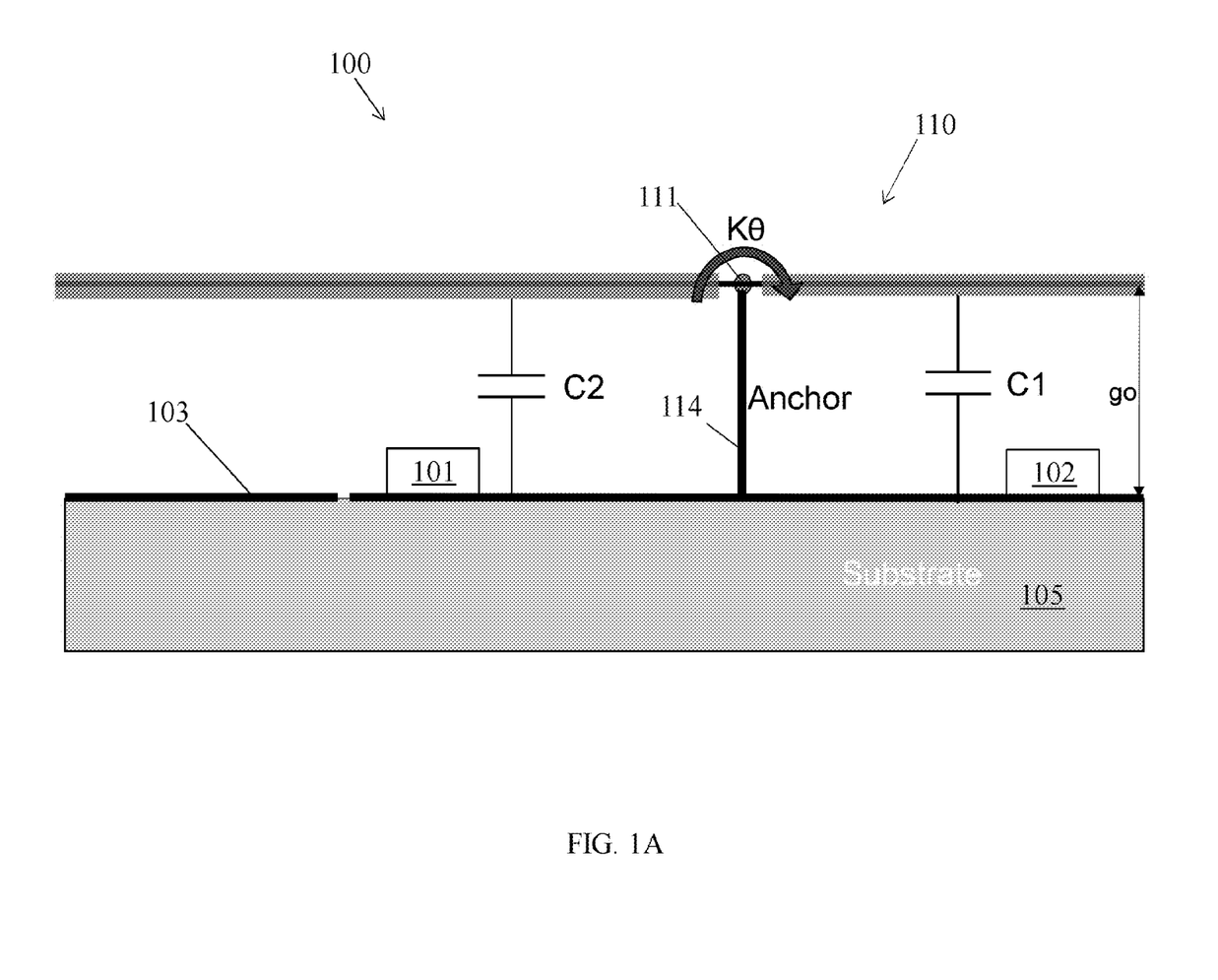
FIG. 1A schematically depicts a Z-axis accelerometer in normal operation.
Figure 1B:
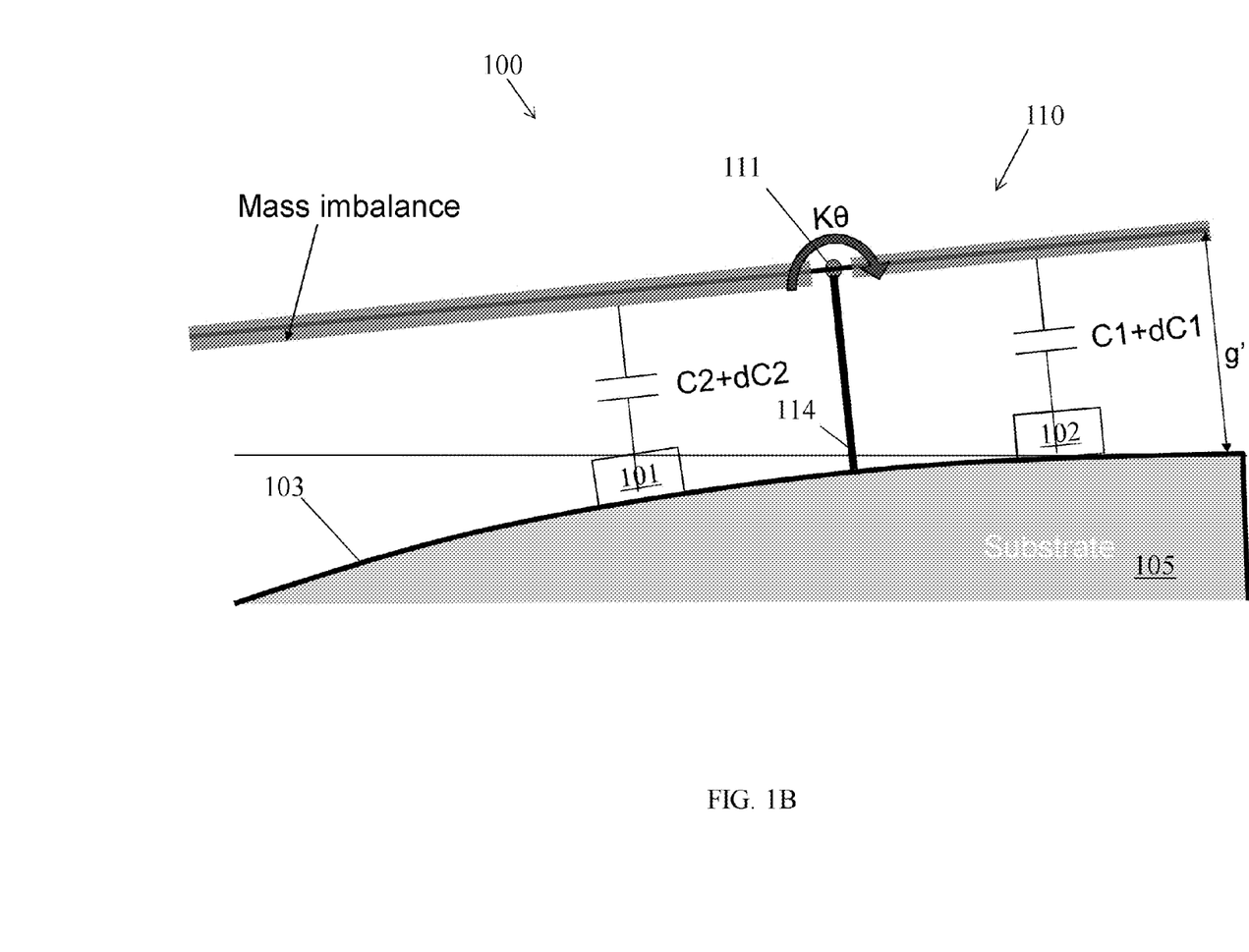
FIG. 1B schematically how an asymmetrical deformation in the substrate of a Z-axis accelerometer produces a zero-g bias offset.

FIG. 1 depicts the impact of an asymmetrical deformation on the substrate 105 of an exemplary teeter-totter type accelerometer 100, where FIG. 1A is a cross-sectional side view of the accelerometer 100 with no substrate deflection and FIG. 1B is a cross-sectional side view of the accelerometer 100 with substrate deflection. The accelerometer 100 includes a proof mass 110 that is supported by a substrate 105 by an anchor 114. The anchor 114 is connected to at least one torsional spring (represented by the circle labeled 111) that, in turn, is connected to the proof mass 110. Differential sense electrodes 101 and 102 on the substrate form parallel plate capacitors C1 and C2 with the proof mass 110. Differential circuitry (not shown) produces an acceleration output signal based on the values of these parallel plate capacitors (i.e., Output=C1−C2).

When the substrate 105 has not been deformed and no external Z-axis acceleration is present as depicted in FIG. 1A, the top surface of the substrate 105 (labeled 103) and the proof mass 110 lie parallel to one another. In this nominal position, sense electrodes 101 and 102 are equidistant with the proof mass 110 and therefore the capacitance C1 between the proof mass 110 and the sense electrode 101 will be equal to the capacitance C2 between the proof mass 110 and the sense electrode 102. Thus, in this undisturbed state:

C1=C2.

The output of the accelerometer is zero:

Output=C1−2=0.

The accelerometer 100 is configured so that, when an external acceleration acts on the accelerometer 100 in the Z axis direction, the proof mass 110 will "teeter-totter" about torsional springs 111 so that the distance between the proof mass 110 and the sense electrode 101 will become different than the distance between the proof mass 110 and the sense electrode 102, thereby changing the capacitances C1 and C2. These changes in capacitance are processed by the differential circuitry to output an acceleration signal:

Output=C1−C2≠0.

When the substrate 105 deforms asymmetrically as depicted in FIG. 1B and represented by reference numeral 103, the disturbance causes the distance between the substrate 105 and proof mass 110 to vary at different positions in the accelerometer 100. This causes the nominal distance between the proof mass 110 and the sense electrode 101 to be different than the nominal distance between the proof mass 110 and the sense electrode 102. Since capacitance is related to the distance between plates, the capacitances between the proof mass 110 and each of the sense electrodes 101 and 102 will be different. Compared to the nominal values of C1 and C2 discussed above with reference to FIG. 1A, the capacitance between the proof mass 110 and sense electrode 101 will be (C1+dC1) and the capacitance between the proof mass 110 and sense electrode 102 will be (C2+dC2), where dC1 and dC2 are typically oppositely signed (i.e., one is positive and the other is negative) and may be different magnitudes (i.e., |dC1|≠|dC2|). Moreover, the changes in capacitance will have different magnitudes, thereby changing the overall capacitance between the substrate 105 and proof mass 110:

$$\Delta C = (C1 + dC1) - (C2 + dC2)$$
$$= dC1 - dC2$$
$$\neq 0$$

As a result, the accelerometer acquires a zero-g bias offset. Moreover, as depicted in FIG. 1B, the proof mass 110 does tilt when the substrate deforms. Nevertheless, the accelerometer 100 still exhibits the zero-g bias offset since the asymmetrical deformation causes the differential capacitance to change non-uniformly across the substrate.

The present solution mitigates the impact of the asymmetrical deformation by tilting the proof mass 110 to follow the substrate deformation. The solution controls the amount of tilting so that the differential capacitances on opposite sides of the proof mass change by the same amount, i.e., dC1=dC2. As a result, ΔC=0.

Figure 2:
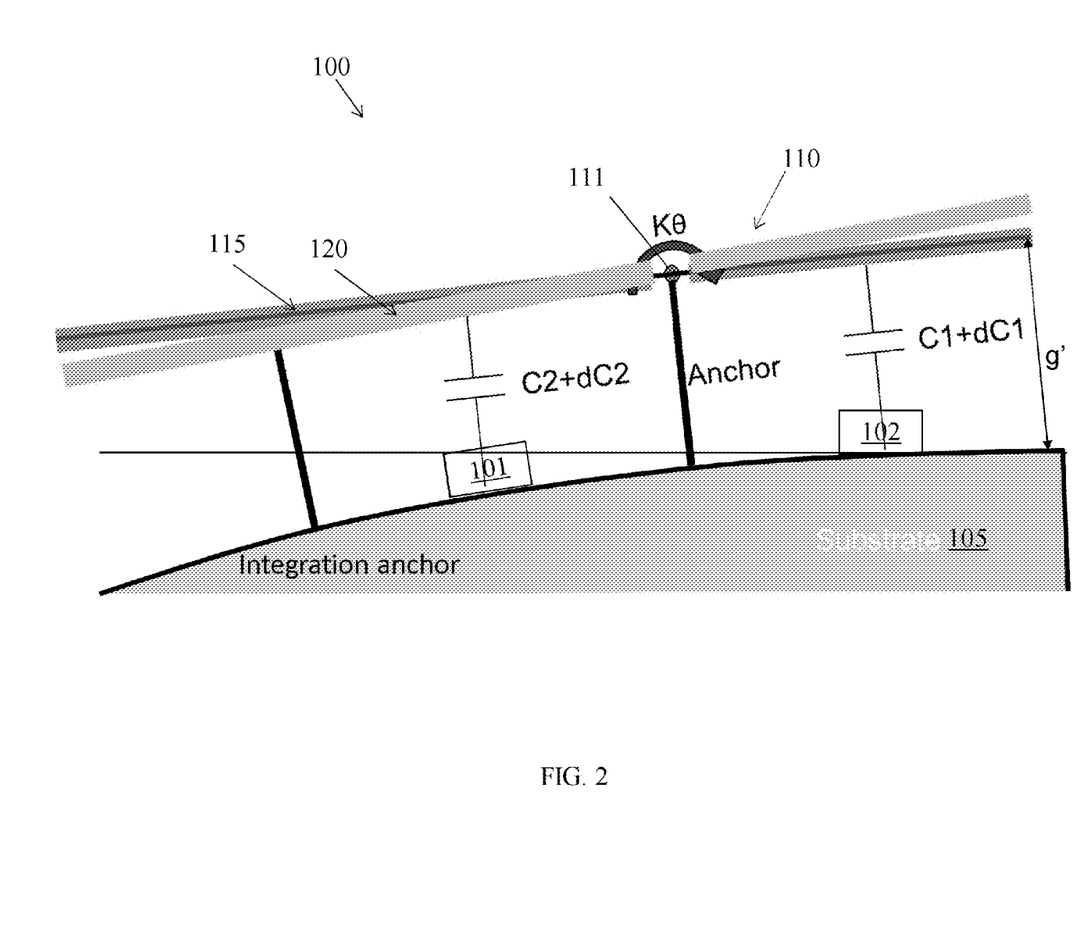
FIG. 2 schematically depicts corrections that the present solution applies to the proof mass to mitigate the zero-g bias offset shown in FIG. 1B.

FIG. 2 compares accelerometers in which the proof mass 110 does and does not follow the deformation. When the accelerometer lacks the present solution and the substrate 105 is asymmetrically deformed, the proof mass 110 may tilt to position 115. As a result, the differential capacitance in one area, C2, changes by a different amount than the differential capacitance in another area, C1. Since C1+dC1≠C2+dC2, the accelerometer 100 experiences a zero-g bias offset.

When the accelerometer 100 does have the present solution, the proof mass 110 tilts to position 120. Since the proof mass 110 more closely forms a parallel plate capacitor with the substrate 105, the capacitance between the two will be more uniform across their respective surfaces. Put another way, the accelerometer 100 with the present solution mitigates the impact of asymmetrical substrate deformation so that resulting changes in capacitance are experienced more uniformly in the device:

(C1+dC1)~(C2+dC2)

As a result, the zero-g bias offset is diminished.

Figure 3:
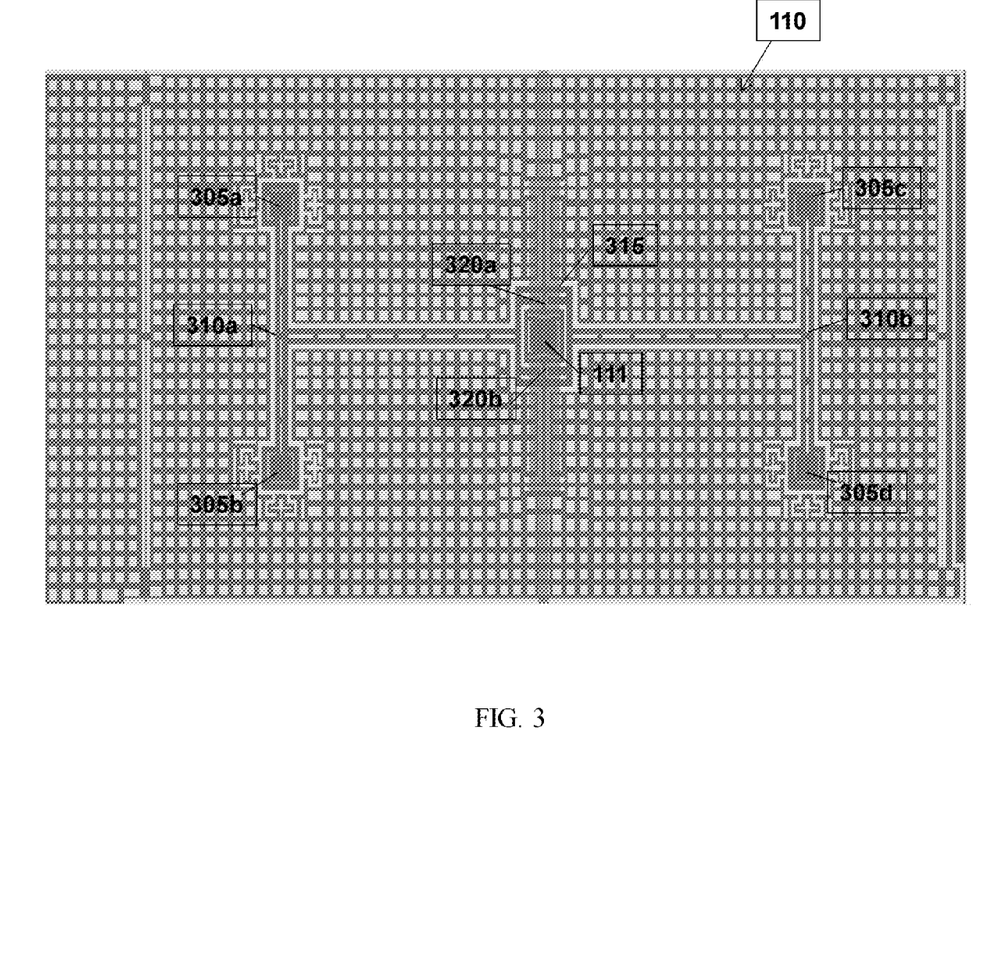
FIG. 3 depicts an exemplary accelerometer with Z axis tracking anchors that reduces the impact of asymmetrical deformation in a substrate.

FIG. 3 depicts an accelerometer 100 that reduces the impact of asymmetrical deformation in a substrate. In this embodiment, the accelerometer 100 includes four tracking anchors 305a, 305b, 305c, 305d (collectively, "305"). Two of the tracking anchors 305a and 305b are connected to a T-shaped beam 310a, and the other two tracking anchors 305c and 305d are connected to the other T-shaped beam 310b. Both T-shaped beams 310a, 310b (collectively, "310") are connected to a frame 315. In turn, this frame 315 is connected to torsional springs 320a, 320b (collectively, "320") that are coupled to the proof mass 110 and its anchor 111. Notably, since these elements are merely beams and posts that are formed from the same material layer as the proof mass 110 and are anchored to the substrate 105 at tracking anchors 305, they are readily incorporated into the accelerometer design and fabrication process flow. Thus, embodiments of the present solution require little, if any, additional space on the die.

In operation, when the substrate 105 experiences asymmetrical deformation, mechanical forces generated by the deflecting tracking anchor(s) 305 are propagated through components of the accelerometer 100 until the forces tilt the proof mass 110 to follow the direction of the deformation. In particular, when the tracking anchor(s) 305 deflect in response to the deformation, the tracking anchor(s) 305 transfer mechanical forces to the T-shaped beam 310 that they are connected to. In turn, the T-shaped beam 310 propagates the forces it receives to the frame 315. The frame 315 applies the forces to the torsional springs 320, which apply a torque to the proof mass 110. As a result, the proof mass 110 tilts to follow the deformation of the substrate 105.

Figure 4:
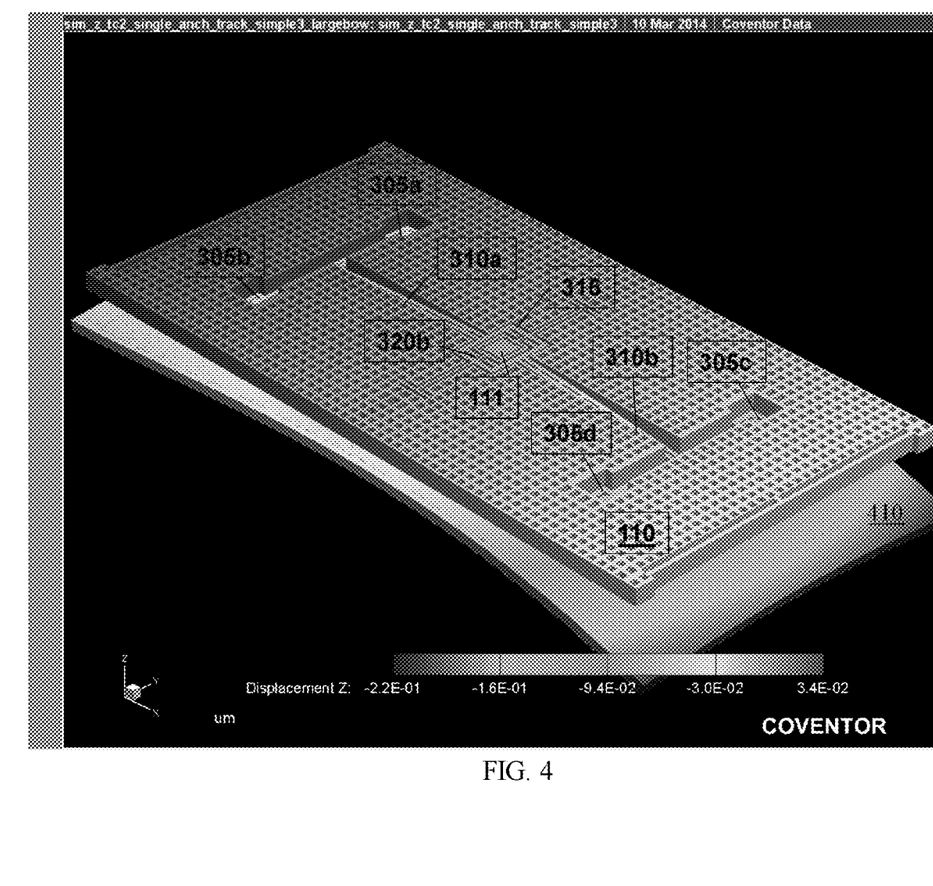
FIG. 4 depicts a perspective view of the accelerometer of FIG. 3 as it responds to substrate deformation.

FIG. 4 depicts a perspective view of the accelerometer of FIG. 3 as it responds to substrate deformation. The figure includes a representation 410 of the substrate's deformation, in which color and/or gradation corresponds to the magnitude of deflection at a particular location. In this embodiment, portions of the substrate proximate to the tracking anchors 305c and 305d are experiencing greater deformations than the portions proximate to the tracking anchors 305a and 305b. As a result, as depicted in FIG. 4, the T-shaped beam 310b deflects more than the T-shaped beam 310a. Nevertheless, both T-shaped beams 310 transfer mechanical forces generated by their respective deflections to rotate the frame 315. In response, the rotated frame 315 transfers mechanical forces to the torsional springs 320 coupled to the anchor of the proof mass 110, and the springs 320 apply a torque to the anchor to tilt the proof mass 110 accordingly.

Figure 5:
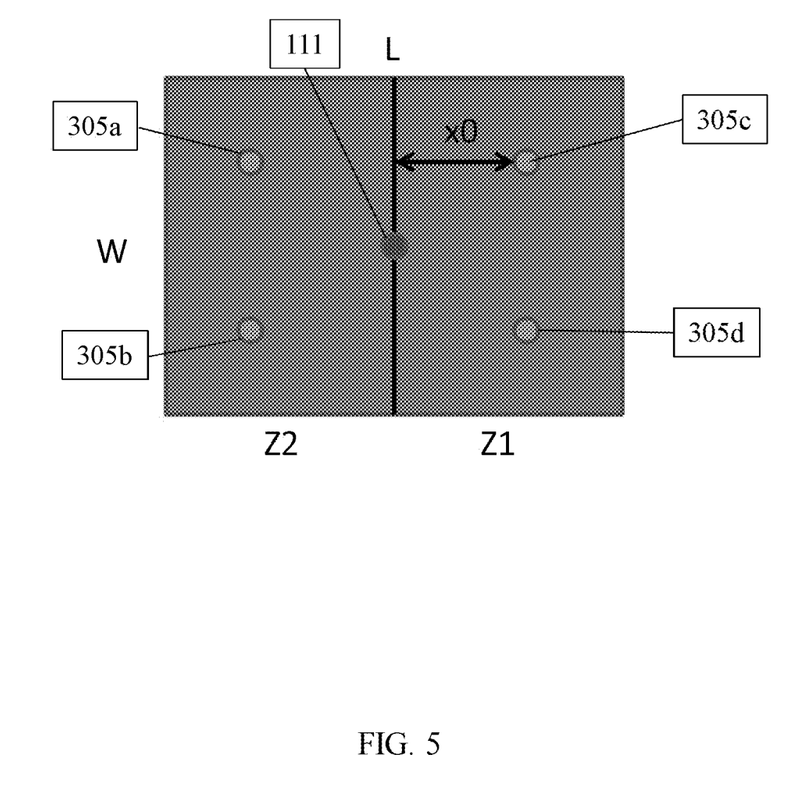
FIG. 5 depicts a schematic view of tracking anchors that have been positioned on the accelerometer to assess deformations in the substrate.

The positions of the tracking anchors 305 on the substrate 105 are a significant feature of the solution. In particular, the anchors 305 should be positioned so that upon deflection, the tracking anchors 305 exert mechanical forces on the T-shaped beams 310 that represent deformations across the entire substrate. FIG. 5 depicts a schematic view of tracking anchors that have been positioned on the substrate in this manner. In this representative embodiment, each tracking anchor 305 has been placed the same distance, x0, from a center axis of the accelerometer. Moreover, the tracking anchors 305 are positioned symmetrically across this center axis.

The positions, x0, may be determined based on the expected, or desired, capacitance between the proof mass 110 and the substrate 105. The following exemplary formula accounts for substrate deformations along the z-axis when modeling this capacitance:

$$\int_{-\frac{W}{2}}^{\frac{W}{2}} \int_0^{\frac{L}{2}} \frac{\varepsilon_0}{\left[go - \frac{x0^2 + \left(\frac{W}{4}\right)^2}{2 \cdot Rsub} + \frac{x^2}{2 \cdot Rsub} + \frac{y^2}{2 \cdot Rsub}\right]} dx\,dy = \frac{\varepsilon_0 \cdot \left(W \cdot \frac{L}{2}\right)}{go}$$

wherein Rsub is the radius of curvature of the substrate.

In this formula, the term with "x0" enables the formula to account for substrate deformations in the z-axis. When this integral is equated with the expected, or desired, capacitance (e.g., the expression on the righthand side of the equation) and solved for x0, the value of x0 becomes:

$$x0 = \frac{1}{12} \cdot (3 \cdot W^2 + 12 \cdot L^2)^{\frac{1}{2}}$$

Notably, to mitigate the zero-g bias offset, the proof mass 110 does not deflect to the same degree or magnitude as the tracking anchors 305. Although the present solution tilts the proof mass 110 to follow the substrate deformation, the solution does not replicate the extent of the substrate deformation in the proof mass 110. In fact, the proof mass 110 must be tilted only a percentage of the tracking anchors' 305 displacement to mitigate the offset properly.

In some embodiments, to ensure that the differential capacitance changes uniformly across the substrate, the proof mass 110 must exhibit only 50% of the displacement of the tracking anchors 305. As demonstrated below, if a proof mass 110 exhibits such behavior, then $$C1 = C0 + dC1 - 0.5*dC1$$

$$C2 = C0 + 0.5*dC1$$

As a result, the offset is C1−C2=dC1−0.5*dC1−0.5*dC1=0.

In contrast, if the proof mass 110 replicates the entire displacement of the tracking anchors 305, the device fails to address the bias offset properly. When the substrate deforms asymmetrically, the differential capacitances around the proof mass 110 change in the following manner:

$$C1 = C0 + dC1$$

C2=C0

Consequently, the offset is C1−C2=dC1.

If the proof mass 110 tilts in a manner that replicates the substrate deformation at the tracking anchor 305 location, such deflection would correct 100% of the change in the differential capacitance C1 on one side of the proof mass 110. Since the proof mass 110 tilts, the differential capacitance C2 on the other side, will also change by the same amount dC1, but of an opposite polarity:

$$C1 = C0 + dC1 - dC1$$

$$C2 = C0 + dC1$$

Consequently, the offset is C1−C2=−dC1. In this situation, the accelerometer 100 would still experience a zero-g bias offset.

In some embodiments, the ratio of the motion of the proof mass 110 to the motion of the tracking anchors 305 may be obtained by solving the following equation:

$$\int_{-\frac{W1}{2}}^{\frac{W1}{2}} \int_{0}^{\frac{L1}{2}} \left[ \frac{\varepsilon_0}{go - \frac{x0^2 + \left(\frac{W}{4}\right)^2}{2 \cdot Rsub} + \frac{x^2}{2 \cdot Rsub} + \frac{y^2}{2 \cdot Rsub}} \right] dx\,dy -$$

$$\int_{-\frac{W1}{2}}^{\frac{W1}{2}} \int_{0}^{\frac{L1}{2}} \left[ \frac{\varepsilon_0}{go + \frac{x \cdot ratio \cdot \left[\frac{(x0)^2}{2 \cdot Rsub}\right]}{x0}} \right] dx\,dy = 0$$

Figure 6:
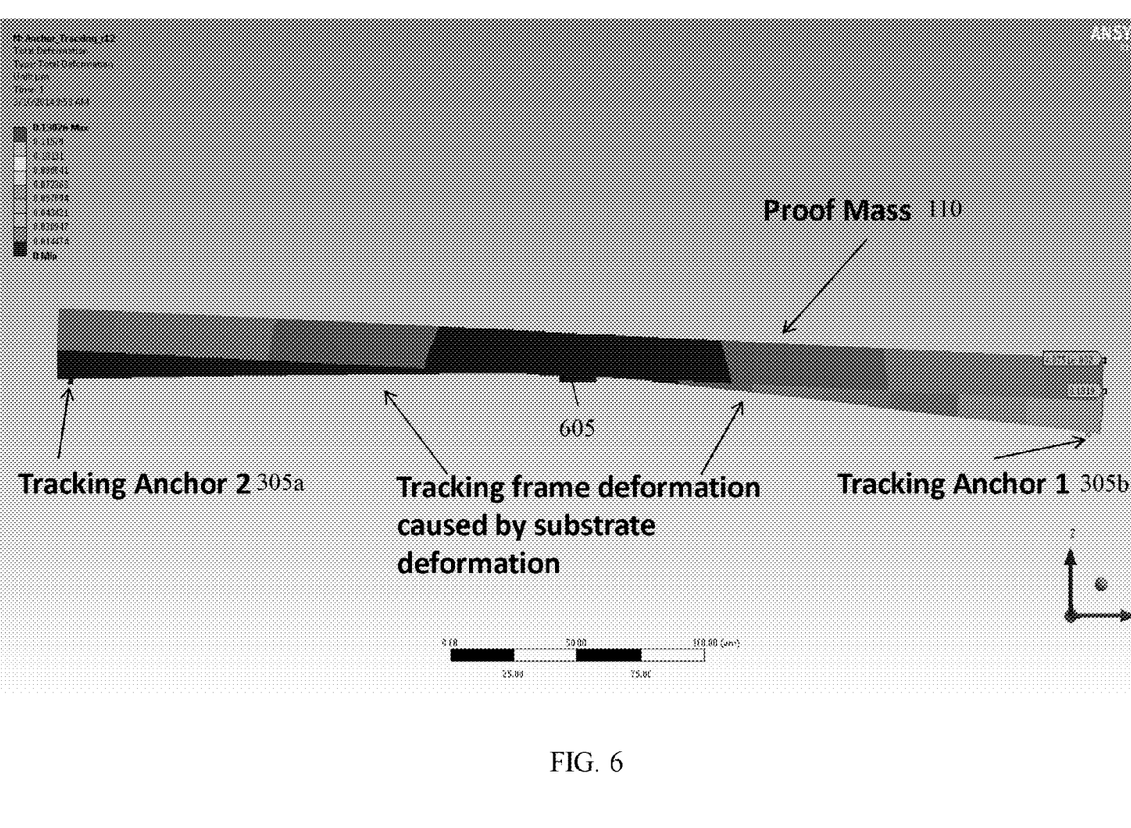
FIG. 6 graphically depicts the deflections of the tracking anchors and the proof mass of an accelerometer.

In one exemplary implementations of the present solution, the ratio was about 0.603. In another exemplary implementation, for which the results have been graphically depicted in FIG. 6, the ratio was about 0.4784. In this figure, a proof mass 110 is coupled to an anchor 605 while tracking anchors 305a, 305b are attached to a substrate. In this particular embodiment, an asymmetrical substrate deformation has caused tracking anchor 305b to deflect 0.1019 μm. Instead of deflecting 0.1019 μm as well, the proof mass 110 has deflected 0.048751 μm. Thus, the ratio of proof mass 110 motion to substrate motion is 0.048751 μm/0.1019 μm, or about 0.4784.

Figure 7:
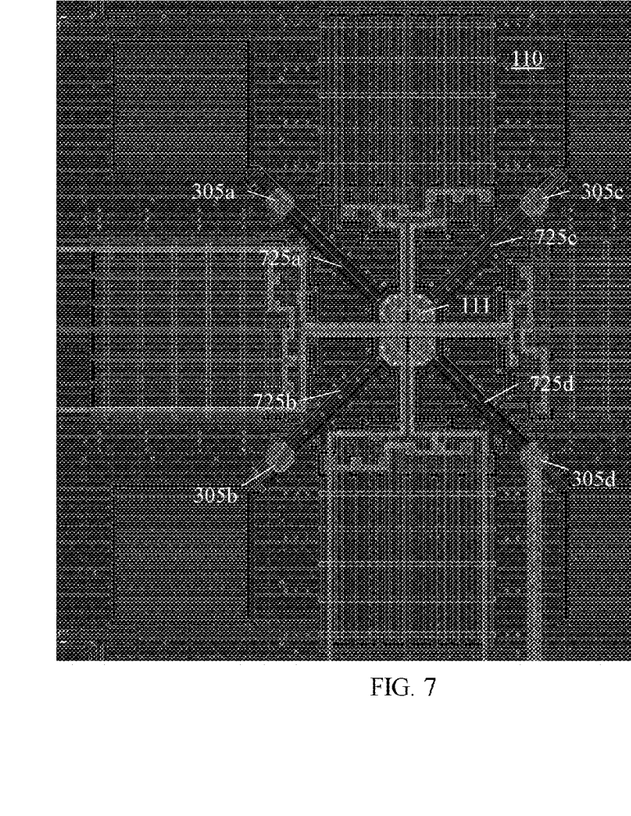
FIG. 7 depicts another exemplary accelerometer that reduces the impact of asymmetrical deformation in a substrate.

FIG. 7 depicts another exemplary accelerometer 700 that reduces the impact of asymmetrical deformation in a substrate. In this embodiment, the tracking anchors 305 are each directly connected to the frame with their respective beams 725. In this manner, each tracking anchor 305 transfers the mechanical force generated by its deflection to the frame, which propagates the force to the proof mass 110. Thus, the proof mass 110 tilts in the direct of the beams 725 to offset the changes in differential capacitance between the proof mass 110 and the sense electrodes. As with the accelerometers described herein, this embodiment provides a solution with modest contributions to the die's footprint.

In various embodiments, on-chip or off-chip circuitry thus can determine the precise amount of acceleration sensed by the accelerometer based on these changing capacitance signals. For example, the off-chip circuitry can include another die implemented as an application specific integrated circuit (ASIC) that is within the same package as the accelerometer, or in another package. Some embodiments may combine the accelerometer die and the ASIC die in a manner where the ASIC die forms a cap on the accelerometer die. Alternatively or in addition, the off-chip circuitry can also include discrete elements and/or multiple circuitry chips.

As noted, the accelerometer typically has some apparatus to protect its fragile microstructure. Accordingly, as noted, the accelerometer may be positioned within a conventional semiconductor package, such as a ceramic cavity package, a pre-molded leadframe package, a carrier package, or some other package-level device. The package preferably is hermetically sealed in various embodiments, and contains a buffering and/or oxidization mitigation gas to further protect the microstructure.

Other embodiments simply cap the die with either a circuit die (e.g., the ASIC noted above) or an inactive cap. Either type of packaging method (i.e., package-level package or die-level package, among others) thus also includes interconnection leads or pads so that the accelerometer can communicate with devices that are external to the package. For example, the package may be mounted to a printed circuit board (e.g., surface mount, through-hole connection, or other type of connection), which may be within a larger system, such as an automobile airbag control system or mobile telephones.

Although various embodiments are described with respect to teeter totter accelerometers, the embodiments of the invention are not limited to these types. The embodiments may encompass tilt mode accelerometers, or any other type of accelerometer as would be appreciated by one of ordinary skill in the art.

The present invention may be embodied in other specific forms without departing from the true scope of the invention, and numerous variations and modifications will be apparent to those skilled in the art based on the teachings herein. Any references to the "invention" are intended to refer to exemplary embodiments of the invention and should not be construed to refer to all embodiments of the invention unless the context otherwise requires. The described embodiments are to be considered in all respects only as illustrative and not restrictive.

What is claimed:

1. A microelectromechanical systems (MEMS) accelerometer comprising:
   a device substrate,
   a suspended proof mass,
   a proof mass support positioned on an axis of rotation of the MEMS accelerometer and movably coupling the suspended proof mass to the device substrate,
   torsional springs that are coupled to the suspended proof mass and proof mass support, and
   a plurality of tracking anchors coupled to the device substrate and a plurality of beams that are coupled to intermediate points on the torsional springs and configured in combination to tilt the suspended proof mass in a direction of asymmetrical deformation of the device substrate.

2. The MEMS accelerometer of claim 1, wherein a ratio of tilt of the suspended proof mass to deflection of at least one of the plurality of tracking anchors in response to the asymmetrical deformation of the device substrate is about 0.5.

3. The MEMS accelerometer of claim 1, wherein a ratio of tilt of the suspended proof mass to deflection of at least one of the plurality of tracking anchors in response to the asymmetrical deformation of the device substrate is between about 0.5 and about 0.603.

4. The MEMS accelerometer of claim 1, wherein a ratio of tilt of the suspended proof mass to deflection of at least one of the plurality of tracking anchors in response to the asymmetrical deformation of the device substrate is between about 0.4784 and about 0.5.

5. The MEMS accelerometer of claim 1, wherein
   at least one of the plurality of tracking anchors is configured to transfer mechanical forces generated in response to the asymmetrical deformation of the device substrate to at least one of the plurality of beams;
   the at least one of the plurality of beams transfers the mechanical forces that it receives to at least one of the torsional springs; and
   the at least one of the torsional springs apply a torque to the suspended proof mass to tilt the suspended proof mass in the direction of the asymmetrical deformation of the device substrate.

6. The MEMS accelerometer of claim 1, further comprising a frame comprising at least one of the plurality of beams, each tracking anchor having a beam of the plurality of beams directly connecting it to the frame, wherein
   each tracking anchor of the plurality of tracking anchors transfers mechanical forces generated in response to the asymmetrical deformation of the device substrate to its respective beam of the plurality of beams;
   each beam of the plurality of beams transfers the mechanical forces that it receives to the frame;
   the frame transfers the mechanical forces that it receives to the torsional springs; and
   the torsional springs apply a torque to tilt the suspended proof mass in a direction of the asymmetrical deformation of the device substrate.

7. The MEMS accelerometer of claim 1, wherein the suspended proof mass is a teeter totter proof mass or a tilt mode proof mass.

8. The MEMS accelerometer of claim 1, wherein:
   (1) each tracking anchor of the plurality of tracking anchors is positioned an equal distance from a center axis of the MEMS accelerometer; and/or
   (2) the plurality of tracking anchors are positioned symmetrically across a center axis of the MEMS accelerometer; and/or
   (3) the distance from any given tracking anchor to a center axis of the MEMS accelerometer is defined by the formula $$\frac{1}{12} \cdot (3 \cdot W^2 + 12 \cdot L^2)^{\frac{1}{2}}$$

in which W is a width of the suspended proof mass and L is a length of the suspended proof mass.

9. The MEMS accelerometer of claim 1, wherein the proof mass support includes at least one anchor attached to the substrate.

10. The MEMS accelerometer of claim 9, wherein the at least one anchor supports the suspended proof mass by the torsional springs.

11. The MEMS accelerometer of claim 1, further comprising circuitry configured to output a signal representative of a position of the suspended proof mass relative to the device substrate, wherein the MEMS accelerometer is configured such that tilting of the suspended proof mass in the direction of the asymmetrical deformation of the device substrate reduces zero-g bias offset introduced by the asymmetrical deformation of the device substrate.

12. The MEMS accelerometer of claim 1, wherein the plurality of beams are symmetrical across a center axis of the MEMS accelerometer.

13. A microelectromechanical systems (MEMS) accelerometer comprising:
   a substrate;
   a support anchor on the substrate;
   a proof mass attached to the substrate by the support anchor and configured to rotate about the support anchor;
   torsional springs that couple the proof mass to the support anchor;
   a frame connected to intermediate points on the torsional springs;
   a first tracking anchor coupled to the substrate;
   a second tracking anchor coupled to the substrate;
   a first beam connected to the frame and having a first end connected to the first tracking anchor; and
   a second beam connected to the frame and having a second end connected to the second tracking anchor.

14. The MEMS accelerometer of claim 13, wherein the first and second tracking anchors are configured to deflect in response to asymmetrical deformation of the substrate and transfer mechanical forces through the frame, first and second beams, and torsional springs to tilt the proof mass in a direction of the asymmetrical deformation of the substrate.

15. The MEMS accelerometer of claim 13, wherein:
   (1) the proof mass is a teeter totter proof mass or a tilt mode proof mass; and/or
   (2) each tracking anchor of the first and second tracking anchors is positioned an equal distance from a center axis of the MEMS accelerometer; and/or
   (3) the first and second tracking anchors are positioned symmetrically across a center axis of the MEMS accelerometer; and/or
   (4) a distance from any given tracking anchor to a center axis of the MEMS accelerometer is defined by the formula $$\frac{1}{12} \cdot (3 \cdot W^2 + 12 \cdot L^2)^{\frac{1}{2}}$$

in which W is a width of the proof mass and L is a length of the proof mass.

16. The MEMS accelerometer of claim 13, further comprising circuitry configured to output a signal representative of a position of the proof mass relative to the substrate, wherein the MEMS accelerometer is configured such that tilt of the proof mass in a direction of asymmetrical deformation of the substrate reduces zero-g bias offset introduced by the asymmetrical deformation of the substrate.

17. A microelectromechanical systems (MEMS) accelerometer comprising:
    a proof mass on a substrate;
    first means for supporting the proof mass;
    torsional springs that are coupled to the proof mass and the first means; and
    second means, separate from the first means and attached to the substrate and a plurality of beams that are coupled to intermediate points on the torsional springs, for deflecting in response to asymmetrical deformation of the substrate, and transferring mechanical forces generated in response to the deflection to tilt the proof mass in a direction of the asymmetrical deformation of the substrate.

18. The MEMS accelerometer of claim 17, wherein:
    the second means include a first tracking anchor and a second tracking anchor; and
    a ratio of tilt of the proof mass to the deflection of at least one of the first and second tracking anchors is between about 0.4784 and about 0.603.

19. The MEMS accelerometer of claim 17, wherein:
    (1) the proof mass is a teeter totter proof mass or a tilt mode proof mass; and/or
    (2) the second means include a first tracking anchor and a second tracking anchor, each tracking anchor of the first and second tracking anchors positioned an equal distance from a center axis of the MEMS accelerometer; and/or
    (3) the second means are positioned symmetrically across a center axis of the MEMS accelerometer; and/or
    (4) a distance from any given tracking anchor to a center axis of the MEMS accelerometer is defined by the formula $$\frac{1}{12} \cdot (3 \cdot W^2 + 12 \cdot L^2)^{\frac{1}{2}}$$

in which W is a width of the proof mass and L is a length of the proof mass.

20. The MEMS accelerometer of claim 17, further comprising circuitry configured to output a signal representative of a position of the proof mass relative to the substrate, wherein the MEMS accelerometer is configured such that tilt of the proof mass in the direction of the asymmetrical deformation of the substrate reduces zero-g bias offset introduced by the asymmetrical deformation of the substrate.

* * * * *